Dec. 10, 1968 B. A. DREYFUS ET AL 3,416,044
OPTO-ELECTRONIC DEVICE HAVING A TRANSPARENT ELECTRODE
THEREON AND METHOD OF MAKING SAME
Filed July 22, 1965
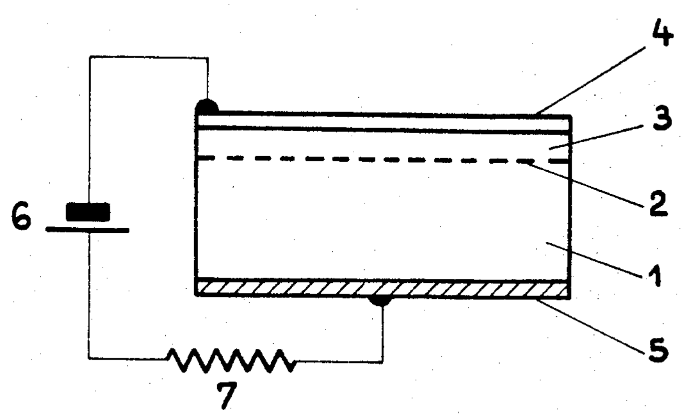
INVENTORS
Bertrand A. Dreyfus
Jean Lavernier
BY Kenyon, Palmer, Stewart & Estabrook
ATTORNEYS

United States Patent Office 3,416,044

Patented Dec. 10, 1968

3,416,044

OPTO-ELECTRONIC DEVICE HAVING A TRANSPARENT ELECTRODE THEREON AND METHOD OF MAKING SAME

Bertrand Alain Dreyfus, Sevres, and Jean Tavernier, Draveil, France, assignors to Societe d'Electronique et d'Automatisme, Courbevoie, Hauts-de-Seine, France Filed July 22, 1965, Ser. No. 474,023
Claims priority, application France, July 23, 1964, 982,750
11 Claims. (Cl. 317—234)

ABSTRACT OF THE DISCLOSURE

A high transparency ohmic contact low resistance film electrode is coated on a face of a body of semi-conductor material at a location which is near to an impurity obtained junction within the body near said face. The film electrode is made of a semi-conductor material which is distinct from that of the body and such electrode is doped with impurities identical to the ones in the region of the junction in the body. The method of deposition of the electrode on the body is such that the doping impurities diffuse from the film to the junction zone or conversely from the junction zone to the film.

The present invention concerns improvements in or relating to opto-electronic devices of the solid-state kind and comprising a zone of conductivity adjacent to a photoelectric conversion junction which must cooperate with a contact electrode.

In such devices as for instance photodiodes, it is usual to provide such electrode which must present an ohmic contact with respect to the semi-conductor body as an annular electrode applied on the edge of a bare surface of said zone so that incident light may reach said surface and activate the material of the body when an appropriate biassing voltage difference is applied across said annular electrode and another electrode established on the opposite face of the body and in ohmic contact therewith. The mechanism of operation, which is well known per se, may be summarized as follows: any photon impinging on the surface free from said peripherical ohmic contact electrode, and which enters the semi-conductor material may give a hole-electron pair, and these particles are separated by the junction field and enter in the formation of the electrical current so generated by the photovoltaic conversion effect.

Since the contact is only made at the periphery there exists a transversal drop of potential all the more important that the point of impact of the photon is farther from the periphery. Obviously, such a voltage drop substantially lowers the efficiency of the photovoltaic converter. It is the object of the invention to practically eliminate such a voltage drop in converters of the above kind.

According to a feature of the invention, in a photovoltaic converter of the kind concerned, the ohmic contact of the surface exposed to an impinging radiation is constituted by a thin translucent film of very low resistance extending over the complete area of said surface.

According to another feature of the invention, such an ohmic contact translucent electrode is of a semi-conductor material of the same type of conductivity as the zone of the surface of the semi-conductor body on which it is applied and, specially, said film material may be constituted of doped stannic oxide.

As known, such a film electrode of stannic oxide may be obtained from pyrolitic dissociation of a solution of tin chloride wherein are provided small additions of compounds of the doping element or elements.

The single figure of the accompanying drawings shows a device illustrating the reduction to practice of the invention. It comprises a semi-conductor body 1, of the P type of conductivity for instance, near one face of which is provided a junction from diffusion, epitaxy or any other suitable known process. Such a junction 2 defines at this place a zone 3 of the N type of conductivity and on said face has been established a translucent film of very low resistance 4 constituting an ohmic contact with the material of said zone. This shown example of embodiment relates to a photovoltaic diode. The rear face of the body 1 is coated with a layer 5 also constituting an ohmic contact with the material of the body and, across the electrodes 4 and 5, a biassing source 6, such as a battery, is connected. The load is shown as a series resistance 7 in the battery circuit.

The basic semi-conductor material of the photodiode may be germanium and the junction may be made from diffusing arsenic or antimony therein. Such elements are equally as known quite favorable additions to tin for the production of translucent low resistance films when introduced as doping impurities (films from 1 to 10 ohms, transparency from 60 to 95% in the visible spectrum of the light and in the near infra-red spectrum). Such a doped oxide will ensure a good ohmic contact on the surface zone of N type of the body 1 of the photovoltaic diode.

The production of such a kind of film layer may be ensured according to any known process, and preferably as follows: the tin chloride is purified and its impurity content, a low one anyway, is of a known order of magnitude, at least for a maximum proportion thereof. A solution of said chloride within diluted hydrochloric acid is conventionally prepared and, separately, a doping solution the content in active doping elements of which is, for equal volumes, in the same ratio with respect to tin that are the above referred impurity content of the solution of tin chloride. However it may be noted that such proportions do not need accuracy because with such additions which are dopes and not additional components in a final complex film of several oxides, the resistivity of the resulting oxide film is not appreciably modified by variations of the doping ratio for relatively large variations of said additions. Just for example, the purified tin chloride usually contains a proportion of impurities of the order of .025% and consequently, the doping impurities in the separate solution will be in the same order of proportion. The two solutions are mixed for the spraying operation onto the body 1 heated at a suitable pyrolitic dissociation temperature as usual.

It will be first considered that the junction 2 has been formed prior to the deposition of the film 4. Said junction has created the requested zone 3 but with a concentration of impurities which is often higher near the surface than near the junction. On the other hand, it would be of advantage that the said concentration be lower near the surface in order to obtain a reduction of the number of the energy states of the surface which produce recombinations of particles at this location and, consequently lower the efficiency of the device. As the pyrolitic dissociation process is conducted with a relatively high temperature of the semi-conductor body 1, neighbouring 650° C. for instance, applicants discover that the impurity dopes are sucked from the zone created near the surface by the junction to the tin oxide film. This phenomenon is advantageous from both the following respects: (1) it reduces the impurity concentration in the N zone of the semi-conductor body 1, consequently increasing the efficiency of the device by reducing the number of energy states of the surface; (2) it favorably increases the doping impurity ratio of the tin oxide which, for the concerned examples of doping materials as referred hereinabove, tends to further lower the square resistance of the film of tin oxide (between 1 and 10 ohms for instance) without appreciably modifying the light transparency of the film.

From such a discovery, applicants have provided a modification of the process of producing the device which avoids the requirement of forming the junction 2 prior to the deposition of the layer 4. Since at the pyrolitic dissociation temperature, doping impurities may diffuse from one semi-conductor to the other one, it becomes feasible to reverse the direction of such a diffusion and consequently to create the junction 2 at the same time as the film is formed. It suffices to introduce in the sprayed solution the junction doping impurity in such a proportion that it simultaneously diffuses within the body 1 near the surface on which the oxide film is formed. Such impurity may be as said arsenic or antimony introduced in the solution in a proportion several times higher than in the first case for the mere doping of the oxide film. Then, in contradistinction with the first phenomenon, it is this higher proportioned impurity which will diffuse within the body of semi-conductor material near the surface of which is thus created a junction from the formation of a zone of the N type of conductivity adjacent to the surface of deposition of the semi-conductor oxide film.

It may be noted that the provision of a continuous oxide film over the surface of the photovoltaic converter exposed to impinging radiations also ensures a protection of said device against destructive particles which might impact on said surface during its utilisation periods.

What is claimed is:

1. An opto-electronic device comprising:

a solid body of semi-conductor material having near one face thereof a zone in which said material is doped with impurities to define a photo-voltaic conversion junction of a conductivity type opposite to that of the remainder of said body, the concentration of impurities in said zone decreasing from said junction to said face;

and a thin film of semi-conductor material, said film being a semi-conductor different from said body, having high optical transparency, low electrical resistance, being of the same conductivity type and doped with the same impurities as said zone, said film being located on said face.

2. An opto-electronic device as defined by claim 1 in which said body is of P-conductivity, said zone is of N-conductivity, said film of N-type doped tin oxide, and the impurities doping the material of said body in said zone are the same as those in the tin oxide and diffused in both said film and said zone.

3. An opto-electronic device as defined by claim 1 in which said body material is germanium and said doping materials are selected from the group consisting of antimony and arsenic.

4. A method of producing an opto-electronic device, comprising:

(a) preparing a pyrolysable solution of a compound of an element, the oxide of which is a high transparency semi-conductor material;

(b) introducing in said solution a doping impurity of said semi-conductor oxide for lowering the electrical resistance thereof;

(c) heating a solid body of a different semi-conductor material of a type of conductivity opposite to that of the oxide semi-conductor material, to the pyrolytic dissociation temperature of said solution; and (d) spraying said solution onto a face of said solid body for simultaneously depositing a high transparency low resistance film of said semi-conductor oxide doped with said impurity and diffusing said impurity within the said solid body near said face for creating a diffiusion photovoltaic conversion junction in said body from said diffusion of impurity therein.

5. Method according to claim 4, wherein the content of said doping impurity in said solution is several times higher than the intrinsic content of uncontrolled impurities in said compound.

6. Method according to claim 5, wherein the said compound is tin chloride and said impurity is taken from the group consisting of arsenic and antimony.

7. Method according to claim 6, wherein said solid body is made of germanium.

8. A method of producing an opto-electronic device, the steps comprising:

(a) preparing a pyrolysable solution of a compound of an element, the oxide of which is a high transparency semi-conductor material;

(b) introducing in said solution a doping impurity for lowering the electrical resistance of said oxide semi-conductor material;

(c) heating a solid body of a different semi-conductor material of the type of conductivity opposite to that of the semi-conductor oxide doped material, said solid body having near one face thereof a photovoltaic conversion junction created by diffusion therein of said impurity; and (d) spraying said solution onto said face of said solid body for simultaneously depositing a high transparency low resistance film of said doped semi-conductor oxide and diffusing part of the doping impurity from said photovoltaic conversion junction in said body within said identically doped semi-conductor oxide film.

9. Method according to claim 8, wherein said doping impurity in said solution is of an amount substantially equal to the amount of intrinsic impurities in said compound.

10. Method acording to claim 8, wherein said compound is tin chloride and said impurity is taken from the group consisting of arsenic and antimony.

11. Method according to claim 10 wherein said solid body is made of germanium.

References Cited

UNITED STATES PATENTS 3,290,175 12/1966 Cusano et al. ---------- 136—89

JOHN W. HUCKERT, *Primary Examiner.*

R. F. SANDLER, *Assistant Examiner.*

U.S. Cl. X.R.

29—572; 313—108